(12) United States Patent
Marchi et al.

(10) Patent No.: US 7,800,234 B2
(45) Date of Patent: Sep. 21, 2010

(54) PROCESS FOR MANUFACTURING DEEP THROUGH VIAS IN A SEMICONDUCTOR DEVICE, AND SEMICONDUCTOR DEVICE MADE THEREBY

(75) Inventors: Mauro Marchi, Bellusco (IT); Marco Ferrera, Concorezzo (IT); Caterina Riva, Cusago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 674 days.

(21) Appl. No.: 11/600,687

(22) Filed: Nov. 16, 2006

(65) Prior Publication Data
US 2008/0197512 A1 Aug. 21, 2008

(30) Foreign Application Priority Data
Nov. 16, 2005 (EP) .................................. 05425807

(51) Int. Cl.
*H01L 23/48* (2006.01)
(52) U.S. Cl. ................. 257/774; 257/773; 257/E23.011
(58) Field of Classification Search ................. 257/773, 257/774, E23.011; 438/109, 638, 639
See application file for complete search history.

(56) References Cited
U.S. PATENT DOCUMENTS
6,458,686 B1 10/2002 Piao

| | | | |
|---|---|---|---|
| 6,815,827 B2 | 11/2004 | Vieux-Rochaz et al. | |
| 6,953,981 B1 | 10/2005 | Johansson et al. | |
| 2004/0079194 A1* | 4/2004 | Nakata et al. | 75/255 |
| 2005/0059204 A1* | 3/2005 | Heschel | 438/222 |

FOREIGN PATENT DOCUMENTS
EP 1 577 656 A 9/2005
WO WO 2005/010422 A 11/2005

OTHER PUBLICATIONS

European Search Report from corresponding European Application No. 05425807.4, filed Nov. 16, 2005.

* cited by examiner

*Primary Examiner*—N Drew Richards
*Assistant Examiner*—Yu-Hsi Sun
(74) *Attorney, Agent, or Firm*—Lisa K. Jorgenson; James H. Morris; Wolf, Greenfield & Sacks, P.C.

(57) ABSTRACT

A process for manufacturing a through via in a semiconductor device includes the steps of: forming a body having a structural layer, a substrate, and a dielectric layer set between the structural layer and the substrate; insulating a portion of the structural layer to form a front-side interconnection region; insulating a portion of the substrate to form a back-side interconnection region; and connecting the front-side interconnection region and the back-side interconnection region through the dielectric layer.

37 Claims, 10 Drawing Sheets

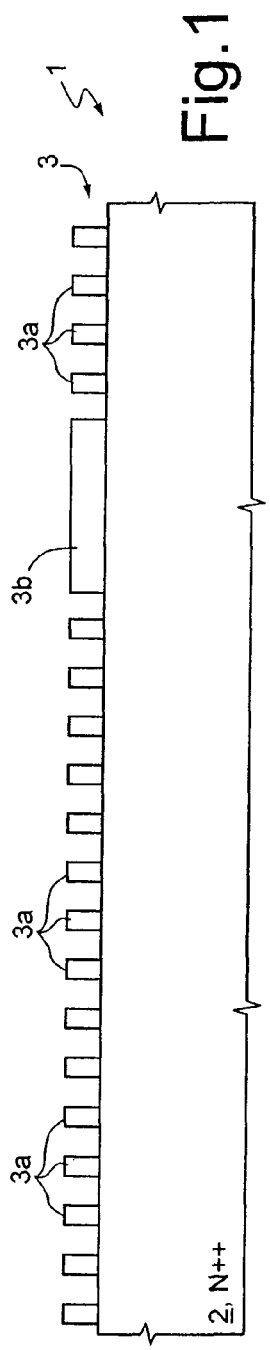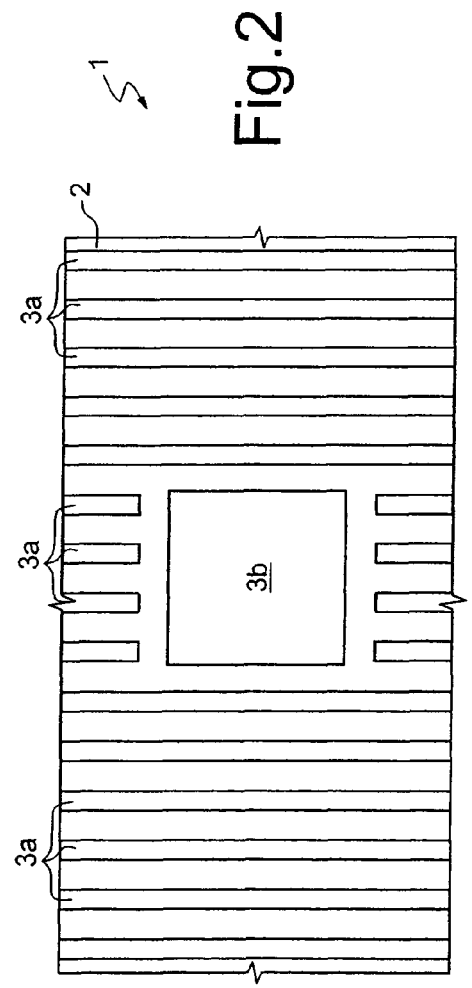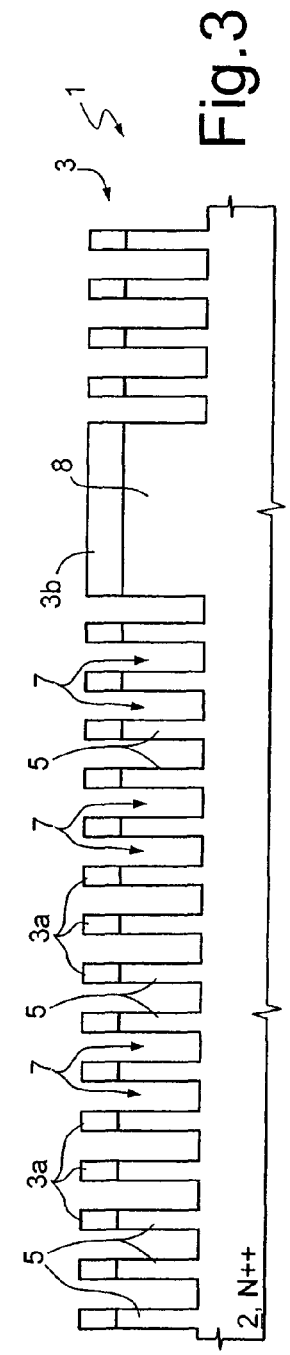

PROCESS FOR MANUFACTURING DEEP THROUGH VIAS IN A SEMICONDUCTOR DEVICE, AND SEMICONDUCTOR DEVICE MADE THEREBY

BACKGROUND OF THE INVENTION

1. Field of the Invention

The present invention relates to a process for manufacturing deep through vias in a semiconductor device and to a semiconductor device made thereby.

2. Discussion of the Related Art

As is known, several electronic or micro-electromechanical semiconductor devices are formed by a number of semiconductor chips assembled together. For example, many MEMS (micro-electromechanical systems) sensors comprise a first chip, wherein a micro-electromechanical structure is formed, and a second chip, bonded and electrically connected to the first chip, where the necessary control circuitry is housed. Other devices can comprise even more than two chips.

Obviously, to electrically connect the different chips it is necessary to provide appropriate conductive connection structures. In less recent devices, said structures included wire connections, which, however, have the disadvantage of being relatively brittle and increase the overall dimensions of the device.

In order to overcome these drawbacks, the use of through conductive vias that traverse the substrate of one of the chips and enable setting-up of a connection between the opposite faces of the chip itself has been proposed. Examples of through vias are described in EP-A-1 151 962, which is incorporated herein by reference. Basically, portions of the substrate of a wafer or of a chip are insulated laterally and form a conductive path through the chip, without increasing the encumbrance.

Also the fabrication of known through vias, however, is not free from drawbacks. In particular, the known processes envisage thinning of the substrate in which the through vias are made. More precisely, cylindrical or prismatic pillars of the substrate are delimited by forming trenches on a front face of the substrate itself down to a predetermined depth. After the trenches have been filled with dielectric material, the substrate is thinned by grinding a rear face, until the pillars and the trenches filled with dielectric material come to the surface. At this point, the pillars are completely insulated from the remainder of the substrate and form through vias.

The operation of grinding, however, subjects the substrate to a remarkable mechanical stress and can cause microcracks in the crystalline structure. In some cases, the damage is particularly serious and causes the substrate to be rejected. In general, the average quality of the substrate machined in the way described is impaired.

SUMMARY OF THE INVENTION

An aim of the present invention is to provide a process and a device that are without the drawbacks described.

According to the present invention, a process for manufacturing through conductive vias in a semiconductor substrate and a semiconductor substrate are provided.

In one embodiment, a process for manufacturing a through via in a semiconductor device, comprises the step of forming a body, comprising a substrate and a structural layer, both of semiconductor material, and a dielectric layer, arranged between said substrate and said structural layer, insulating a portion of said structural layer to form a front-side interconnection region insulating a portion of said substrate to form a back-side interconnection region and connecting said front-side interconnection region and said back-side interconnection region through said dielectric layer.

In another embodiment a semiconductor device comprises a body, the body including a substrate of semiconductor material, a structural layer of semiconductor material, a dielectric layer arranged between said substrate and said structural layer, and a through interconnection via traversing said body, wherein said through interconnection via extends through said dielectric layer.

BRIEF DESCRIPTION OF THE DRAWINGS

For a better understanding of the invention, some embodiments thereof are now described, purely by way of non-limiting example and with reference to the attached drawings, wherein:

FIG. 1 is a cross-sectional view through a semiconductor wafer in an initial step of a manufacturing process according to a first embodiment of the present invention;

FIG. 2 is a top plan view of the wafer of FIG. 1;

FIGS. 3-7 show the same view as that of FIG. 1, in successive manufacturing steps;

DETAILED DESCRIPTION

Figure 4:
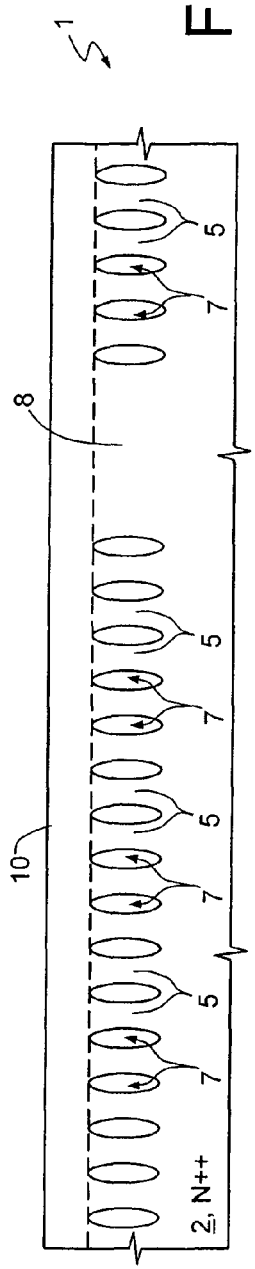

FIGS. 1 and 2 show a first wafer 1 including a substrate 2 made of high conductivity semiconductor material, for example N++ type monocrystalline silicon. The first wafer 1 is initially subjected to machining steps to provide a buried insulating layer, substantially using selectively the process described in EP-A-1 326 272 or in EP-A-1 324 382, both of which documents are incorporated herein by reference.

In particular, a mask 3 is first formed on the substrate 2. The mask 3 comprises first mask regions 3a, which have an elongated rectangular shape and are arranged parallel to one another, and second mask regions 3b, for example having a square shape, set on portions of the substrate 2 that are to subsequently form through interconnection vias (for reasons of simplicity, just one second mask region 3b is illustrated in the figures). Alternatively, the first mask regions 3a have a hexagonal shape and present a honeycomb arrangement.

The substrate 2 is then anisotropically etched using the mask 3, as illustrated in FIG. 3. In this way, underneath the first mask regions 3a parallel walls 5 are formed, which have a length much greater than the width and are separated from one another by separation trenches 7. The walls 5, in practice, are arranged so as to form a comb-like structure, as illustrated in the cross-sectional view of FIG. 3. Furthermore, the separation trenches 7 laterally delimit a continuity region 8 of the substrate 2, protected by the second mask region 3b.

After removing the mask 3 (FIG. 4), an epitaxial layer 10 of N type is grown, which closes at the top and partially fills the separation trenches 7. The epitaxial growth takes place in a deoxidizing environment, rich in hydrogen molecules, which are entrapped within the separation trenches 7.

Figure 5:
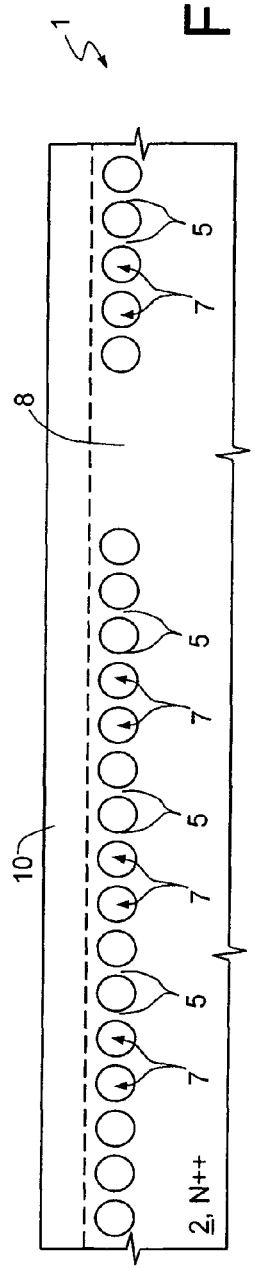

By exploiting the deoxidizing environment within the separation trenches 7, a thermal step of annealing is then performed (FIG. 5). In practice, the first wafer 1 is heated to a controlled temperature for a predetermined period of time (for example, 1150° C. for 1 h). In these conditions, the semiconductor material which forms the pillars 5 is subject to migration and tends redistribute according to a minimum energy configuration, maintaining in any case the order of the monocrystal. In practice, the pillars 5 tend to thin out and, at the same time, the height of the separation trenches 7 decreases.

Figure 6:
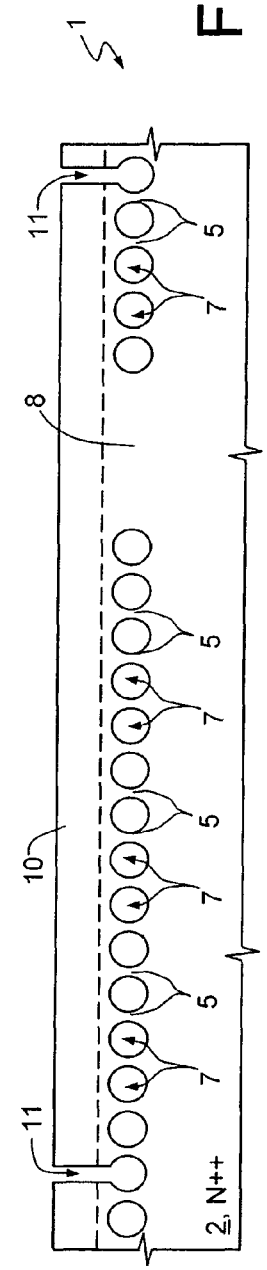
Figure 7:
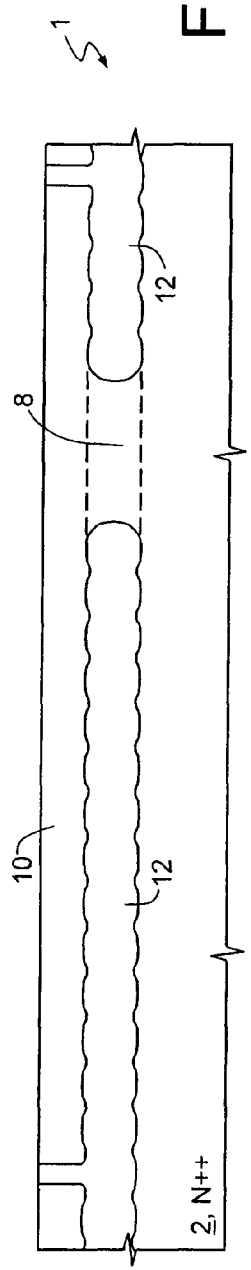

Next, access trenches 11 are opened for supplying oxygen to the separation trenches 7, as illustrated in FIG. 6, and a thermal oxidation is performed. In this step, the pillars 5 are completely oxidized, and the separation trenches 7 are filled up with silicon oxide. Consequently, at the end of the oxidation process a buried dielectric layer 12 is formed, as illustrated in FIG. 7. The buried dielectric layer 12 extends therefore over the whole substrate 2, separating it from the epitaxial layer 10, except for the continuity region 8, which is not substantially modified by the annealing process and by the subsequent thermal oxidation. The substrate 2 and the epitaxial layer 10 are then electrically connected through the continuity region 8. In the subsequent figures, the buried dielectric layer 12 and the continuity region 8 are illustrated for reasons of convenience in a simplified way; for the same reason, the access trenches 11 are no longer illustrated.

Figure 8:
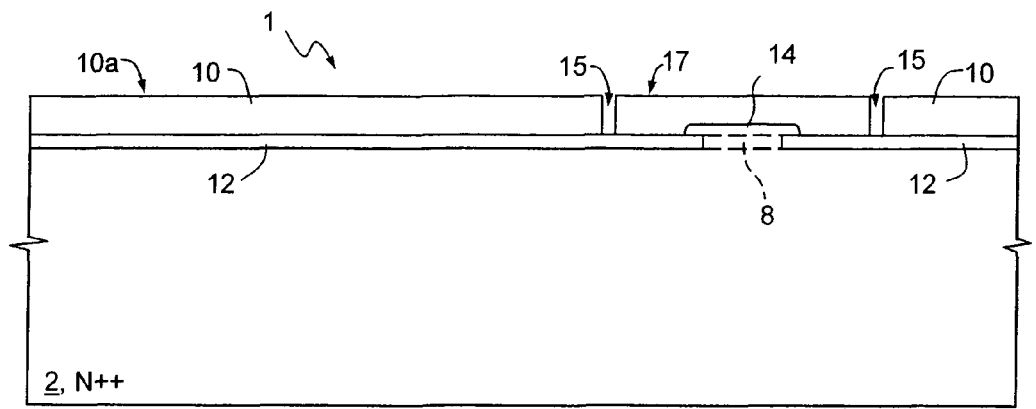
FIG. 8 shows the wafer of FIG. 7 in a manufacturing subsequent step, not drawn to scale.

With reference to FIG. 8, a deep implant is carried out to create a buried high-conductivity region 14, of an N+ type, around the continuity region 8. More precisely, the high-conductivity region 14 is formed in contact with the continuity region 8 and extends into the epitaxial layer 10.

Figure 9:
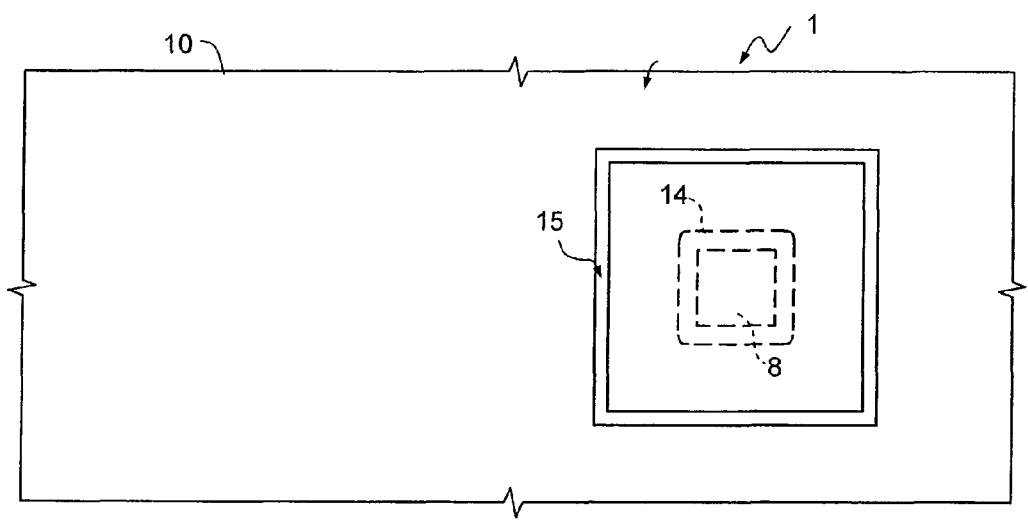
FIG. 9 is a top plan view of the wafer of FIG. 8.

Next, the epitaxial layer 10 is etched to open a front-side insulation trench 15, as illustrated also in FIG. 9 (first trench etch). The expression "front side" will be used hereinafter to indicate that the entities which said expression refers to are located or extend between the buried dielectric layer 12 and a "front" face of the wafer 1, defined by a free surface 10a of the epitaxial layer 10. Furthermore, the expression "back side" will be used to indicate that the entities which said expression refers to are located or extend between the buried dielectric layer 12 and a "back" face of the wafer 1, defined by a free surface 2a of the substrate 2.

The front-side insulation trench 15 extends along a closed line, for example a square or rectangular polygonal line, which develops around the continuity region 8 and the high-conductivity region 14. Furthermore, the front-side insulation trench 15 extends in depth so as to reach the buried dielectric layer 12 and thus insulates a front-side interconnection region 17 from the remainder of the epitaxial layer 10. The front-side interconnection region 17 is electrically connected to the substrate 2 through the continuity region 8.

Figure 10:
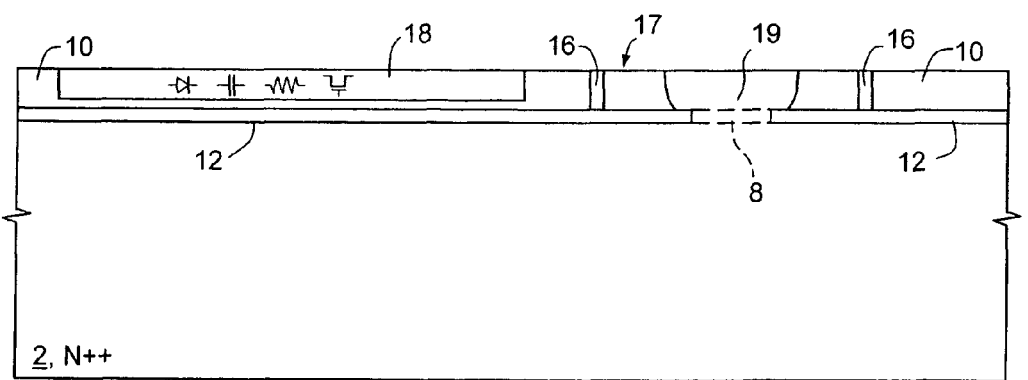
FIGS. 10 and 11 show the same view as that of FIG. 8, in subsequent manufacturing steps.

By depositing a silicon-oxide layer (not illustrated) and subsequent planarizing the first wafer 1, the front-side insulation trench 15 is filled with silicon oxide, and an insulating structure 16 is formed, which separates the front-side interconnection region 17 from the epitaxial layer 10 (FIG. 10).

Alternatively, the front-side insulation trench 15 can be opened together with the access trenches 11. In this case, the insulating structure 16 is obtained during the thermal oxidation simultaneously with the buried dielectric layer 12, since the insulation trench 15 is filled by the thermally grown silicon oxide.

The epitaxial layer 10, which is monocrystalline, is then machined with conventional fabrication steps to provide (on the outside of the front-side interconnection region 17) a control circuit 18, illustrated schematically in FIG. 10 by means of symbols of active and passive electrode components. In this step, also a deep conductive region or sinker 19 of an N+ type is formed within the front-side interconnection region 17. The sinker 19 extends as far as the continuity region 8 and incorporates the high-conductivity region 14.

Figure 11:
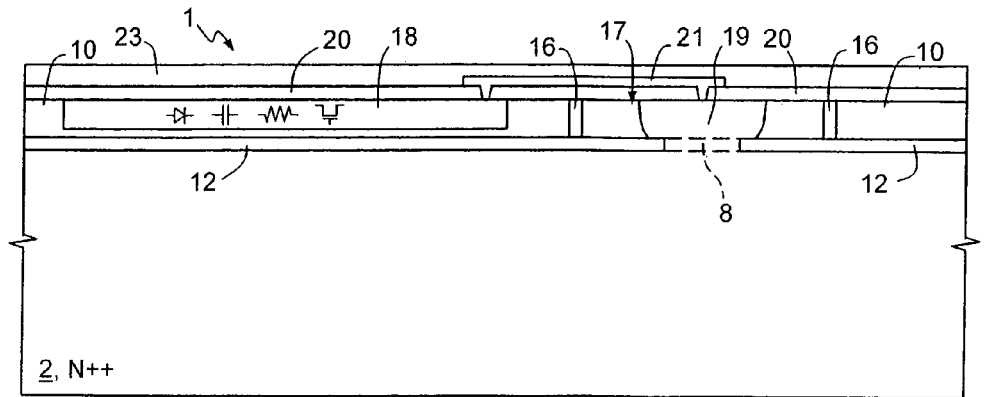

Machining of the top part of the first wafer 1 is terminated as illustrated in FIG. 11. In particular, a surface dielectric layer 20 is deposited on the epitaxial layer 10 and opened above the sinker 19 and predetermined contact areas of the control circuit 18. Then, metal connection lines 21 are made between the sinker 19 and the control circuit 18, through the openings in the surface dielectric layer 20. In practice, the connection lines 21 are made so as to restore an electrical connection selectively between the front-side interconnection region 17 and predetermined points of the epitaxial layer 10. A protective layer 23 is then deposited on the surface dielectric layer 20 so as to encase the connection lines 21.

Figure 12:
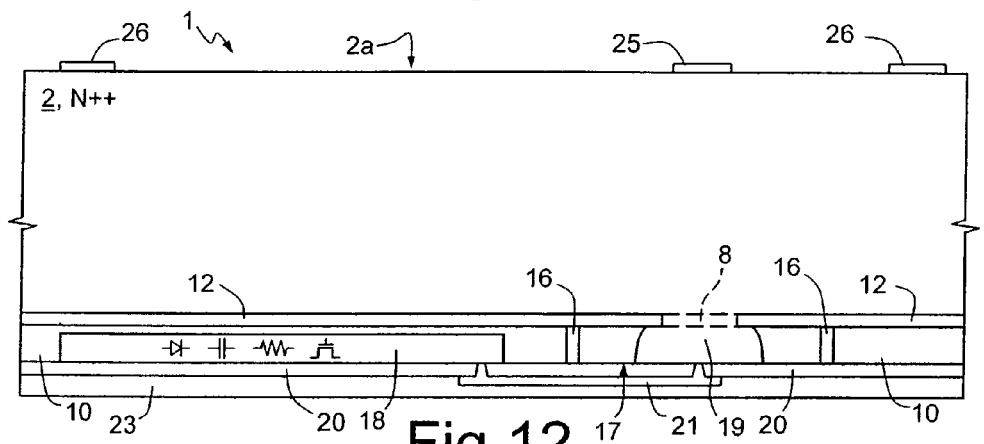
FIG. 12 shows the wafer of FIG. 11 turned upside down and in a subsequent manufacturing step.
Figure 13:
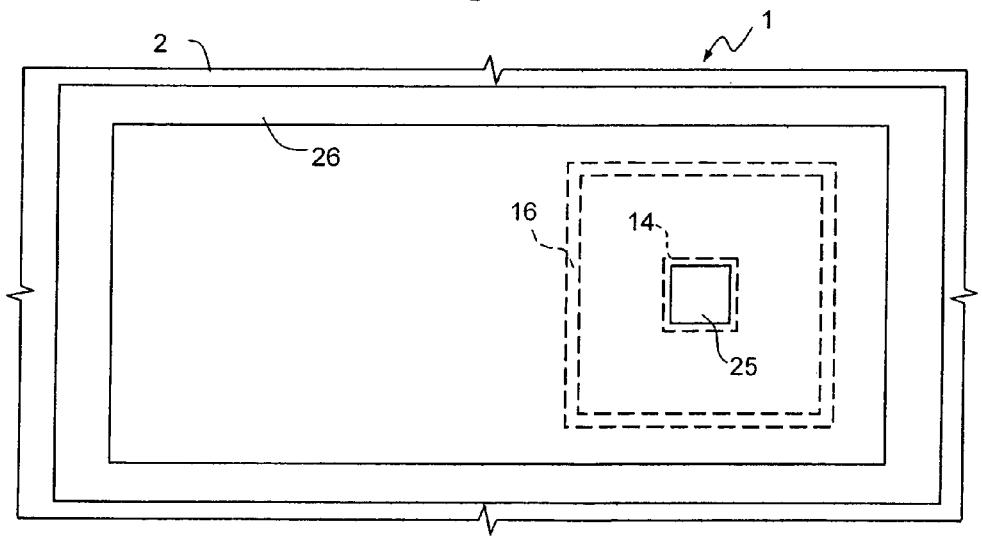
FIG. 13 is a top plan view of the wafer of FIG. 12.

The first wafer 1 is then turned upside down and machined on the back, as illustrated in FIGS. 12 and 13. In the first place, a contact pad 25 and a bonding ring 26, both made of metal are made on the free surface of the substrate 2. The pad 25 is aligned to the continuity region 8 and to the sinker 19. The bonding ring 26 surrounds the pad 25, which is located in an off-centre position.

Figure 14:
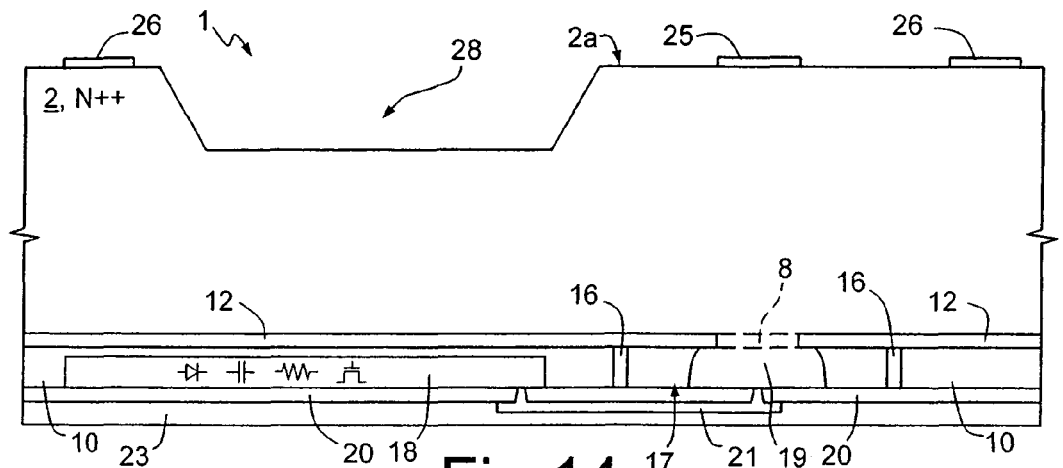
FIGS. 14 and 15 show the same view as that of FIG. 12, in subsequent manufacturing steps.

As illustrated in FIG. 14, a cavity defining a housing 28 is formed in the substrate 2 within the bonding ring 26, laterally and at a distance from the pad 25.

Figure 15:
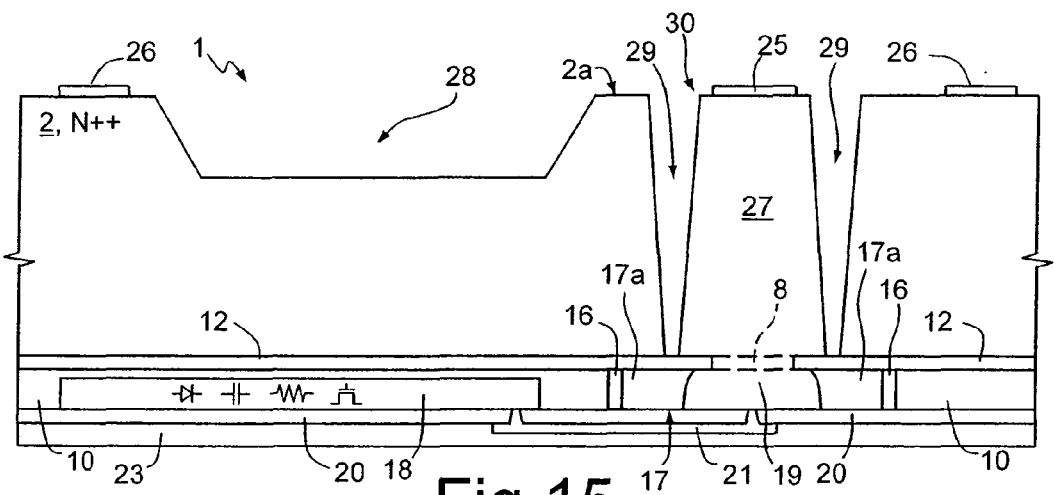
Figure 16:
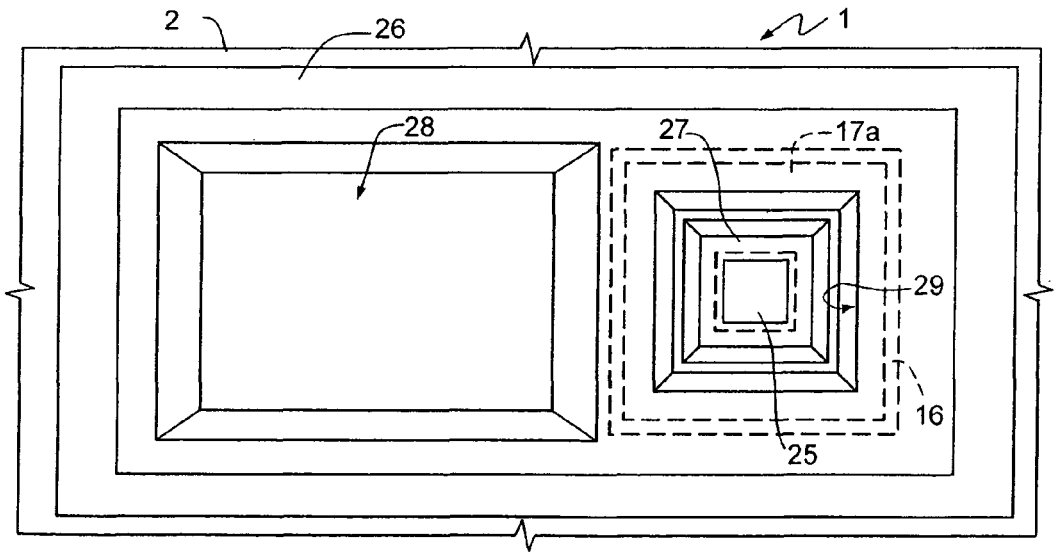
FIG. 16 is a top plan view of the wafer of FIG. 15.

Next (FIGS. 15 and 16), a deep trench etch is performed to insulate a back-side interconnection region 27 from the remainder of the substrate 2. More precisely, in this step a back-side insulation trench 29 is formed, which extends along a closed polygonal line around the pad 25 and traverses the entire substrate 2 until the buried dielectric layer 12 is uncovered. In this way, a through interconnection via 30 is obtained, which connects the opposite faces of the first wafer 1. The through via 30 includes the front-side interconnection region 17, the back-side interconnection region 27 and the continuity region 8 and is hence formed in part in the substrate 2 and in part in the epitaxial layer 10, on opposite sides of the buried dielectric layer 12. The insulating structure 16 and the back-side insulation trench 29 insulate laterally the through via 30 from the remainder of the first wafer 1. Furthermore, the continuity region 8 is sized so as not to reduce significantly the conductivity of the through via 30.

Figure 17:
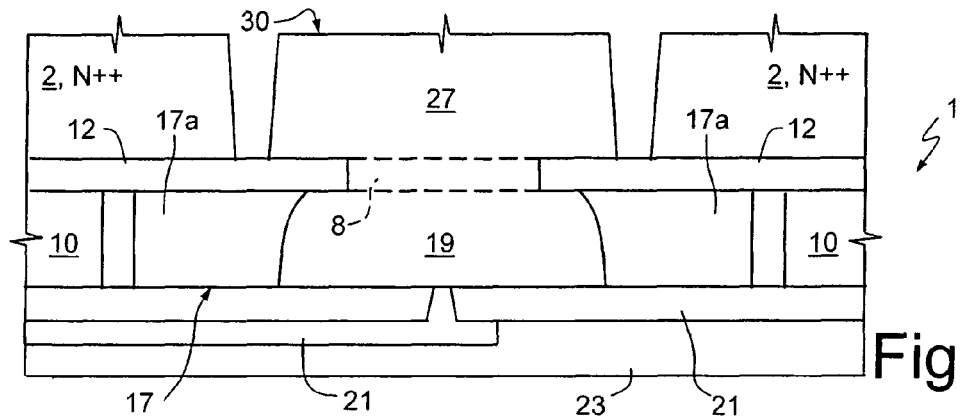
FIG. 17 shows an enlarged detail of FIG. 15.

The back-side insulation trench 29 is moreover sized so that a frame 17a of the front-side interconnection region 17 extends laterally on the outside of the exposed portion of the buried dielectric layer 12 (see also the enlarged detail of FIG. 17). Consequently, the frame 17a is bonded to the substrate 2 through the buried dielectric layer 12 and functions as anchorage for the through via 30. The back-side interconnection region 27 is anchored to the buried dielectric layer 12 and directly to the continuity region 8.

Figure 18:
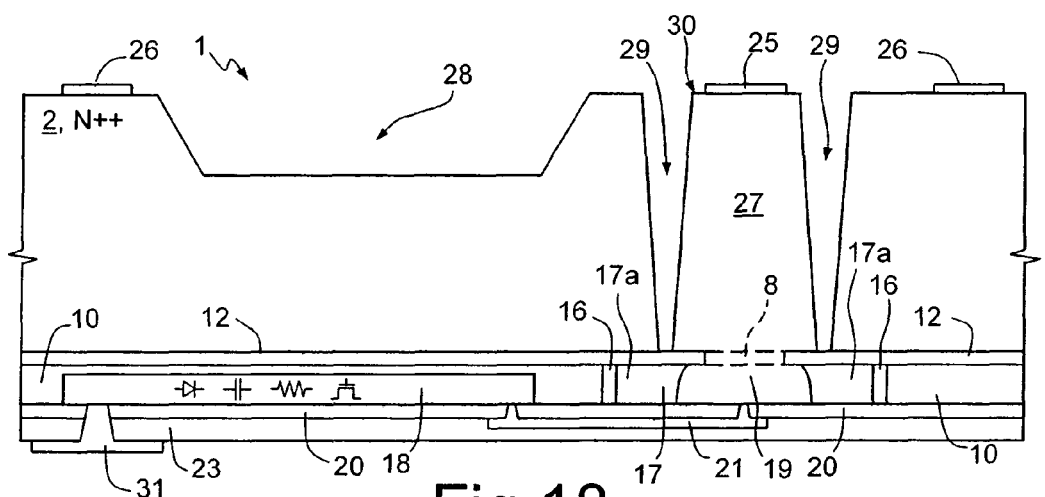
FIGS. 18 and 19 show the same view as that of FIG. 15, in subsequent manufacturing steps.

As illustrated in FIG. 18, the protective layer 23 and the surface dielectric layer 20 are then opened and pads 31 are made for the control circuit is 18. Processing of the first wafer 1 at this point is substantially terminated.

Figure 19:
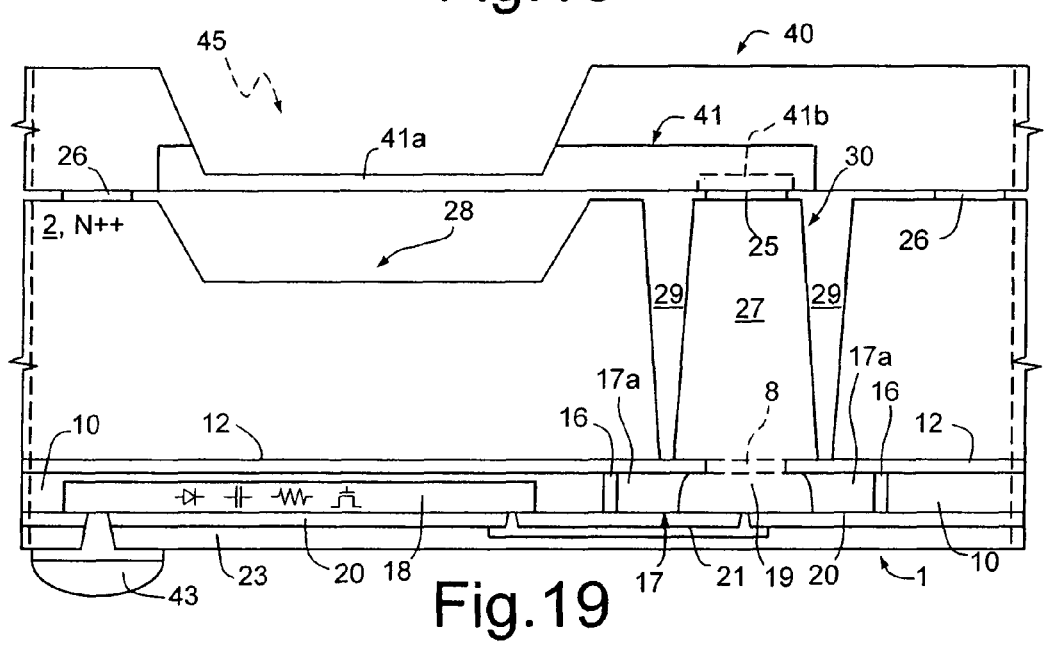

Then (FIG. 19), a second semiconductor wafer 40, in which a sensor 41 has previously been made, is bonded to the wafer 1, using the bonding ring 26. In the embodiment described herein, the sensor 41, which in FIG. 19 is illustrated only schematically, is a microphone and is arranged so that mobile transduction members, in this case a membrane 41a, are facing the housing 28. An electrical-connection portion 41b is instead arranged in contact with the pad 25 made on the back-side interconnection region 27 of the through via 30. "Bumps" 43, for bonding onto a conventional supporting board, are then made.

The first wafer 1 functions as a cap for the sensor 41 and houses the control circuit 18 necessary for its operation. The electrical connection between the sensor 41 and the control circuit 18 is ensured by the through via 30.

Finally, the first wafer 1 and the second wafer 40 are cut into dice 45, each of which comprises a control circuit 18, a through via 30, and a sensor 41.

The process described advantageously enables manufacturing a through via in a simple way by processing a single semiconductor wafer, without any need to thin out the wafer by grinding. A partial reduction of the thickness of the wafer, even though not necessary, is in any case compatible with the process according to the invention, should this be required for independent reasons, for example for requirements of encumbrance.

The manufacturing of through vias by means of the process described is moreover substantially immune from problems of alignment, in particular as regards opening of the front-side insulation trench 15 and the back-side insulation trench 29.

A further advantage derives from the possibility of exploiting the epitaxial layer, made of monocrystalline silicon, for manufacturing the necessary control circuitry.

Figure 20:
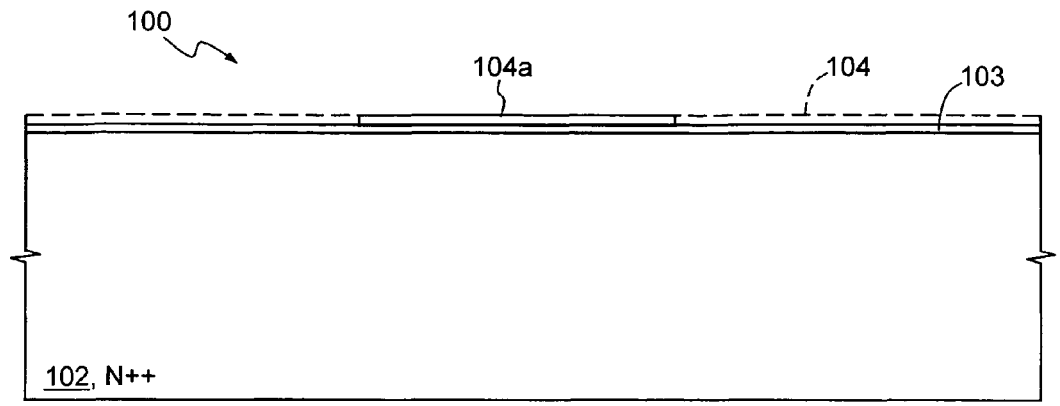
FIGS. 20-23 show a cross-sectional view through a semiconductor wafer in successive steps of a manufacturing process in accordance with a second embodiment of the present invention.

A second embodiment of the invention is illustrated in FIGS. 20-26. In particular, FIG. 20 shows a wafer 100 comprising a substrate 102 made of semiconductor material with extremely high conductivity, for example N++ type monocrystalline silicon. A dielectric layer 103, of silicon oxide, and a conductive layer 104, of polysilicon, are deposited in sequence on the substrate 102. The conductive layer 104 is then shaped, to provide at least one connection line 104a.

Figure 21:
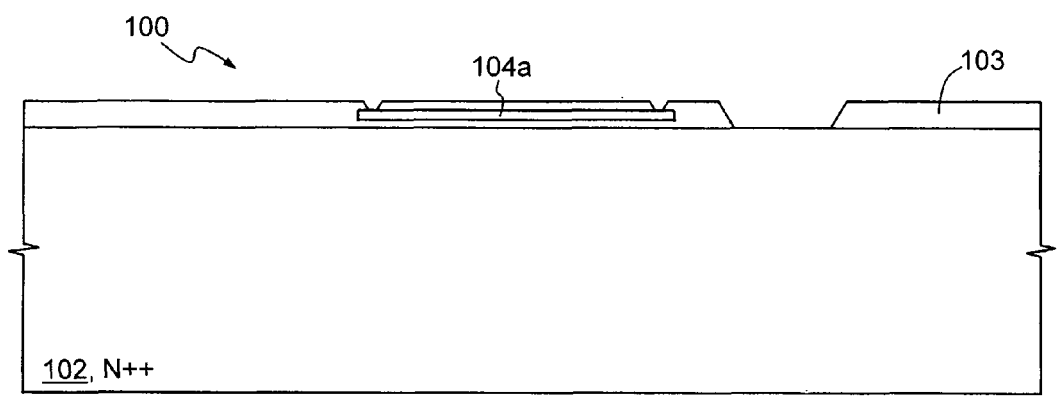

Next, FIG. 21, by a further deposition of silicon oxide, the thickness of the dielectric layer 103 is increased, until the connection line 104a is encased. The dielectric layer is then opened at the ends of the connection line 104a and above a region of the substrate 102 where a through interconnection via will subsequently be formed.

Figure 22:
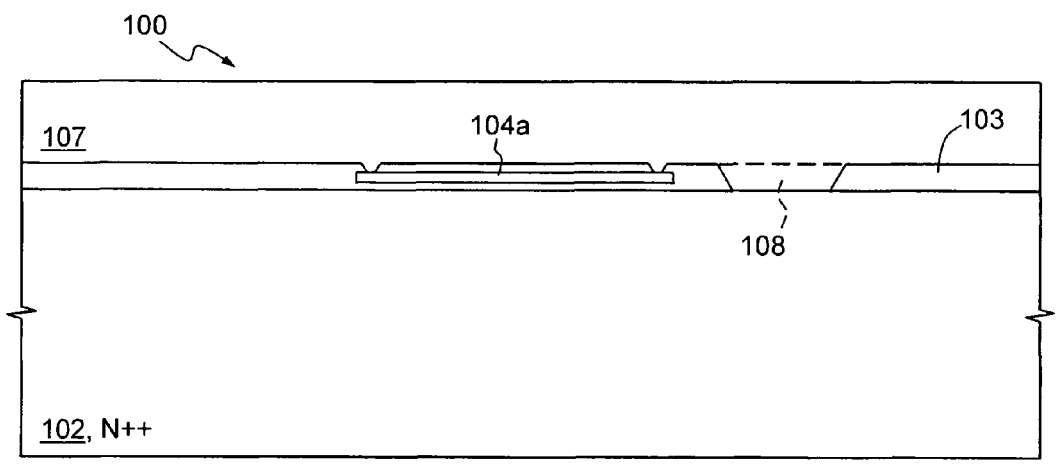

As illustrated in FIG. 22, a structural layer 107, of heavily doped polycrystalline silicon, of N+ type, is then deposited on top of the dielectric layer 103, which thus remains buried. The structural layer 107 contacts, through the openings previously made, the connection line 104a and the substrate 102. In other words, the dielectric layer 103 separates the structural layer 107 from the substrate 102 except in a continuity region 108 which traverses the dielectric layer 103 itself.

Figure 23:
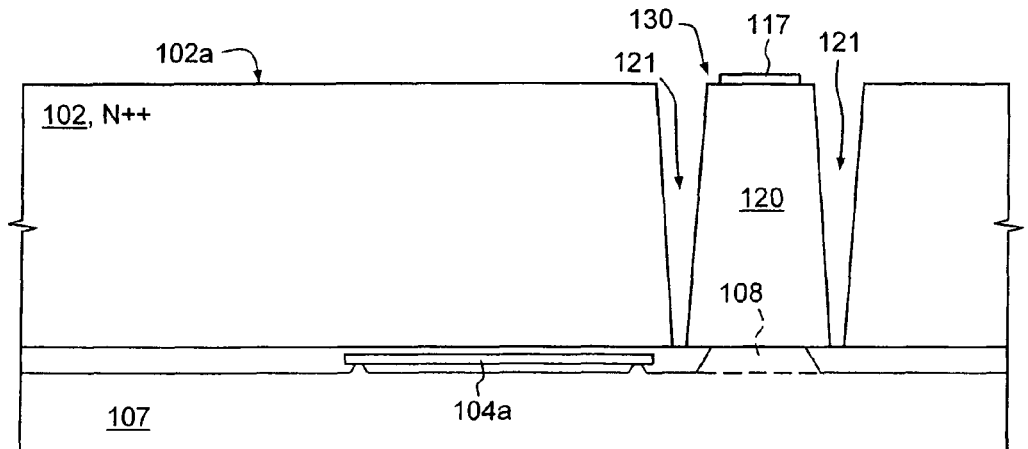

The wafer 100 is then turned upside down and machined on the back, as illustrated in FIG. 23. The expression "back side" will hereinafter be used to indicate that the entities to which said expression refers are located or extend between the dielectric layer 103 and a "back" face of the wafer 100, defined by a free surface 102a of the substrate 102. Furthermore, the expression "front side" will be used to indicate that the entities to which said expression refers are located or extend between the dielectric layer 103 and a "front" face of the wafer 100, defined by a free surface 107a of the structural layer 107. On the "back" face of the wafer 100, defined as has been said by the free surface 102a of the substrate 102, a contact pad 117 is made, aligned to the continuity region 108. Then, a first deep trench etch is performed to insulate a back-side interconnection region 120 from the remainder of the substrate 102. More precisely, in this step, a back-side insulation trench 121 is formed, which extends along a closed polygonal line around the pad 117 and traverses the entire substrate 102, until the dielectric layer 103 is uncovered.

Figure 24:
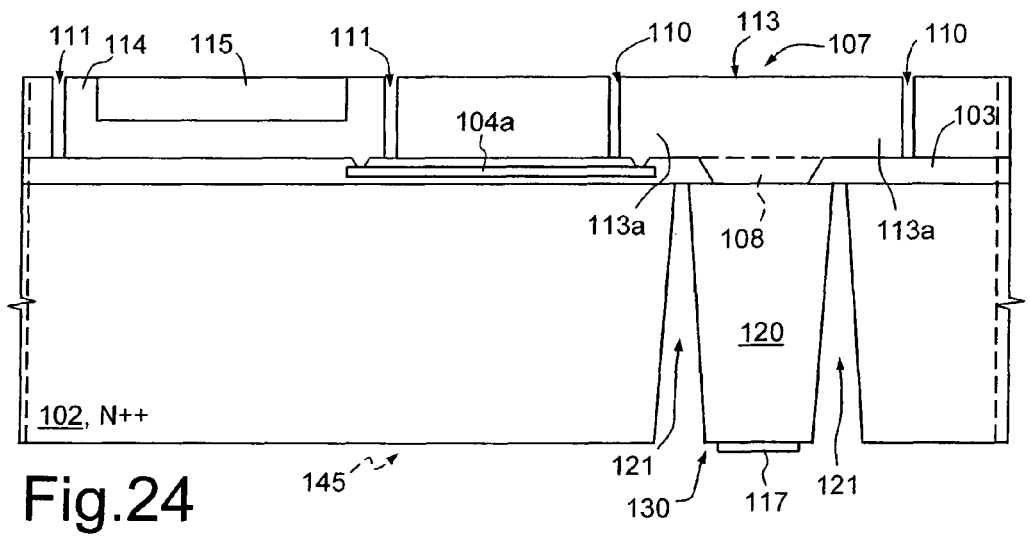
FIG. 24 is a top plan view of the wafer of FIG. 23.
Figure 25:
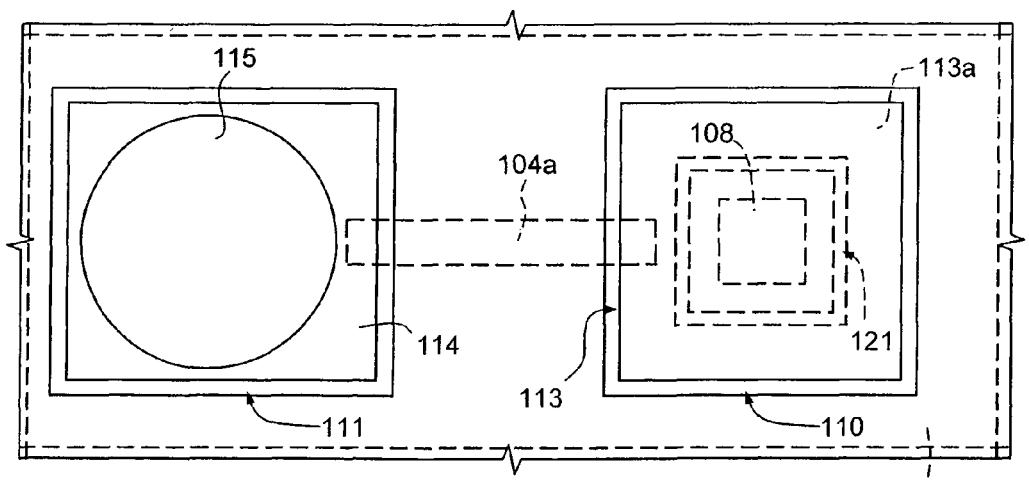
FIG. 25 shows the wafer of FIG. 23, turned upside down and in a final manufacturing step.

After the wafer 100 has been turned upside down again, a second trench etch of the structural layer 107 is performed, which stops at the dielectric layer 103 (FIGS. 24 and 25). In this step a front-side insulation trench 110 and a sensor-insulation trench 111 are formed, both of which extend along closed polygonal lines and are deep enough to reach the dielectric layer 103. The front-side insulation trench 110 delimits a front-side interconnection region 113 around the continuity region 108, insulating it from the remainder of the structural layer 107.

In this way, a through interconnection via 130 is made, which connects the opposite faces of the wafer 100. The through via 130 includes the front-side interconnection region 113, the back-side interconnection region 120 and the continuity region 108 and is hence formed in part in the substrate 102 and in part in the structural layer 107, on opposite sides of the dielectric layer 103. The front-side insulation trench 110 and the back-side insulation trench 121 laterally insulate the through via 130 from the remainder of the wafer 100. Furthermore, the continuity region 108 is sized so as not to reduce significantly the conductivity of the through via 130.

Figure 26:
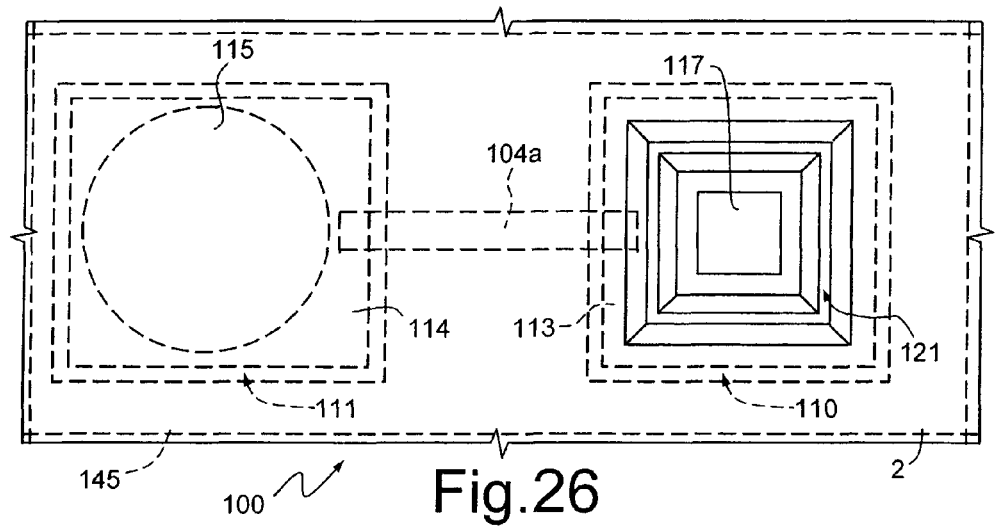
FIG. 26 is a top plan view of the wafer of FIG. 25.

Also in this case, the back-side insulation trench 121 is sized so that a frame 113a of the front-side interconnection region extends laterally on the outside of the exposed portion of the dielectric layer 103 (see also FIG. 26). Consequently, the frame 113a is bonded to the substrate 102 through the dielectric layer 103 and functions as anchorage for the through via 130. The back-side interconnection region 120 is anchored to the dielectric layer 103 and directly to the continuity region 108.

The sensor-insulation trench 111 delimits a sensor region 114, which is also insulated from the remainder of the structural layer 107. The connection line 104a connects the front-side interconnection region 113 and the sensor region 114. Within the sensor region 114 there is then made, in a way in itself known, a micro-electromechanical or MEMS sensor 115, for example a rotational accelerometer.

Finally, the wafer 100 is cut into dice 145, each of which comprises a through via 130 and a sensor 115. Possibly, before the cutting into dice, a cap wafer (not shown) can be applied on the "front" face of the wafer 100 to protect the sensor 115.

The above described embodiment of the invention has the advantage of being readily integrable in different manufacturing processes of micro-electromechanical devices, in addition to being simple to carry out.

Figure 27:
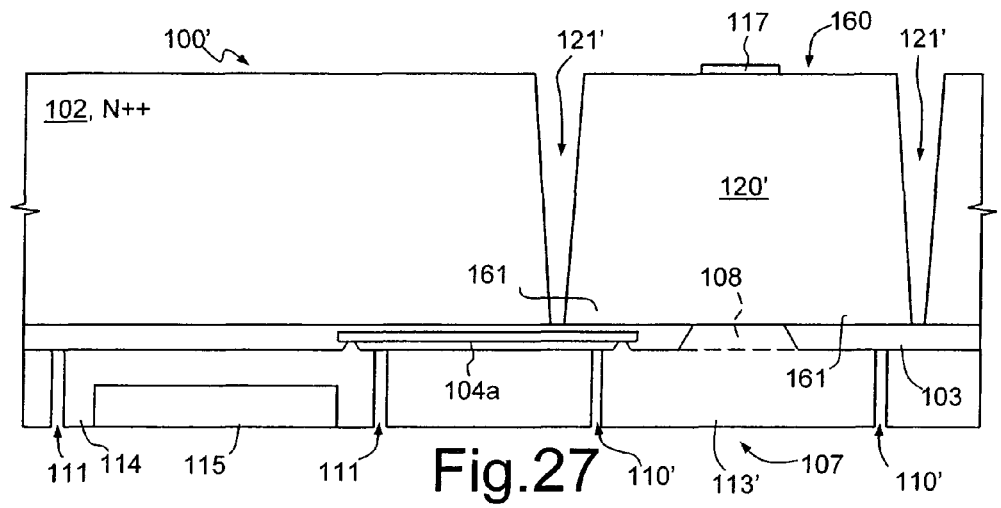
FIG. 27 is a cross-sectional view through a semiconductor wafer in a step of a manufacturing process in accordance with a third embodiment of the present invention.
Figure 28:
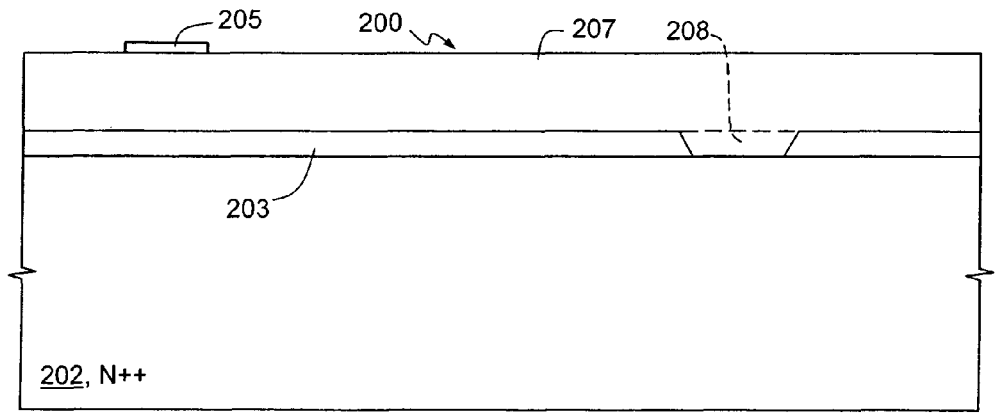
FIGS. 28 and 29 show a cross-sectional view through a semiconductor wafer in successive steps of a manufacturing process in accordance with a fourth embodiment of the present invention.

FIG. 27, where parts that are the same as those already illustrated in FIGS. 20-26 are designated by the same reference numbers, shows a third embodiment of the invention. In this case, the front-side insulation trench 110' and the back-side insulation trench 121', opened during the second trench etch and the first trench etch, respectively, are shaped so that the back-side interconnection region 120', delimited by the back-side insulation trench 121', will be wider than the front-side interconnection region 113', delimited by the front-side insulation trench 110'. There is thus obtained a through interconnection via 160, which comprises the front-side interconnection region 113', the back-side interconnection region 120' and the continuity region 108 and extends on opposite sides of the dielectric layer 103. According to this embodiment, the back-side interconnection region 120' projects laterally with respect to the front-side interconnection region 113' and has a frame 161 that is bonded to the structural layer 107 through the dielectric layer 103 and functions as anchorage for the through via 160.

According to a variant (not illustrated), the connection line is made of polysilicon on top of the structural layer, as in the case of FIGS. 11-19, instead of being embedded in the dielectric layer.

A fourth embodiment of the invention is illustrated in FIGS. 28-31. In this case, a wafer 200 comprises a substrate 202 made of semiconductor material with extremely high conductivity, for example monocrystalline silicon of an N++ type, which is completely coated with a dielectric layer 203, for example deposited silicon oxide. The dielectric layer 203 is then opened above a region of the substrate 203, where a through interconnection via will be made. A structural layer 207 of N+ type polycrystalline silicon is then deposited. The structural layer 207 contacts the substrate 102 through the opening previously made in the dielectric layer 203. Consequently, the dielectric layer 203 separates the structural layer 207 from the substrate 202 except in a continuity region 208, which traverses the dielectric layer 203 itself. On the structural layer 207 a contact pad 205 is then made, in an off-center position with respect to the continuity region 208.

Figure 29:
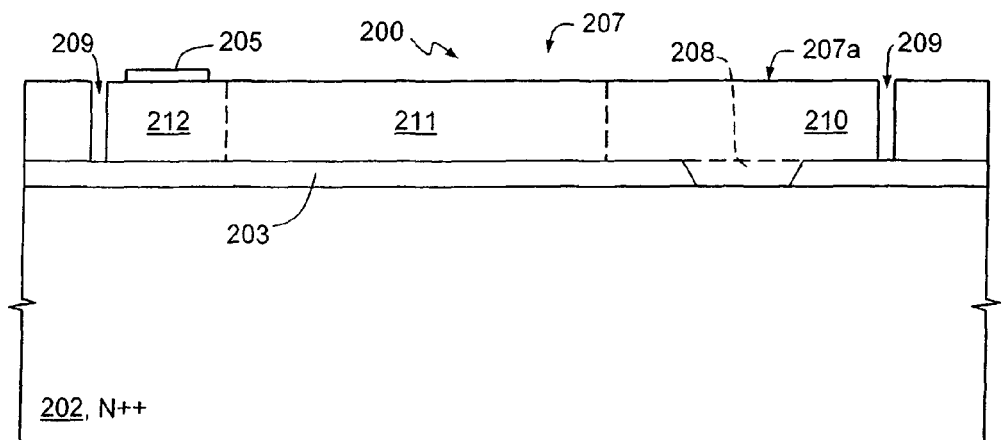
Figure 30:
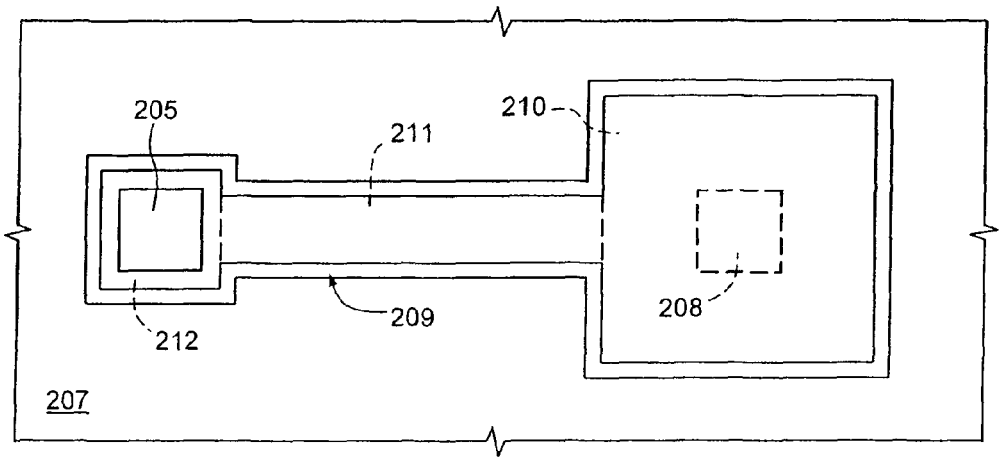
FIG. 30 is a top plan view of the wafer of FIG. 29.

Next, a first trench etch is performed, as illustrated in FIGS. 29 and 30. In this step a front-side insulation trench 209 is formed, which extends along a closed polygonal line and reaches, in depth, the dielectric layer 203. The expression "front side" will be hereinafter used to indicate that the entities to which said expression refers are located or extend between the dielectric layer 203 and a "front" face of the wafer 200, defined by a free surface 207a of the structural layer 207. Furthermore, the expression "back side" will be used to indicate that the entities to which said expression refers are located or extend between the dielectric layer 203 and a "back" face of the wafer 200, defined by a free surface 202a of the substrate 202. The front-side insulation trench 209 delimits a front-side interconnection region 210 around the continuity region 208, a routing region 211, which has an elongated shape and projects laterally from the front-side interconnection region 210 towards the pad 205, and a contact region 212, on which the pad 205 is arranged.

Figure 31:
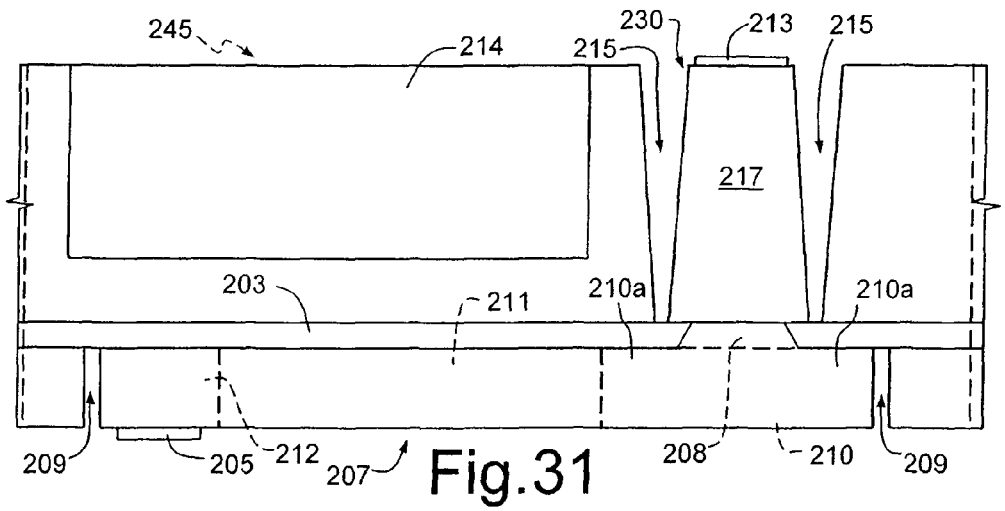
FIG. 31 shows the wafer of FIG. 29, turned upside down and in a final manufacturing step.

The wafer 200 is then turned upside down and machined on the back, as illustrated in FIG. 31. In particular, after forming a pad 213 aligned to the continuity region 208, a micro-electromechanical structure 214 is made in a portion of the substrate 202 in a known way. By a second trench etch a back-side insulation trench 215 is opened, which delimits a back-side interconnection region 217, separating it from the remainder of the substrate 202.

The back-side insulation trench 215 extends along a closed polygonal line around the pad 213 and traverses the entire substrate 202, until the dielectric layer 203 is uncovered. In this way, a through high-conductivity interconnection via 230 is made, which connects the opposite faces of the wafer 200. The through via 230 includes the front-side interconnection region 210, the back-side interconnection region 217, and the continuity region 208 and is hence formed in part in the substrate 202 and in part in the structural layer 207, on opposite sides of the dielectric layer 203. The front-side insulation trench 209 and the back-side insulation trench 215 insulate laterally the through via 230 from the remainder of the wafer 200. Furthermore, the continuity region 208 is sized so as not to reduce significantly the conductivity of the through via 230.

Also in this case, the back-side insulation trench 215 is sized so that a frame 210a of the front-side interconnection region 210 extends laterally on the outside of the exposed portion of the dielectric layer 203. Consequently, the frame 210a is bonded to the substrate 202 through the dielectric layer 203 and functions as anchorage for the through via 230. The back-side interconnection region 217 is anchored to the dielectric layer 203 and directly to the continuity region 208. The routing region 211, the contact region 212, and the pad 205 enable supply and picking-up of electrical signals in a point that is off-centre with respect to the through via 230.

Finally, the wafer 200 is cut into dice 245, each of which comprises a through via 230 and a micro-electromechanical structure 214.

Finally, it is evident that modifications and variations can be made to the process and device described herein, without departing from the scope of the present invention as defined in the annexed claims. In the first place, the shape of the first and of the back-side interconnection region, as well as of the continuity region, does not necessarily have to be quadrangular, but can be chosen at will (for example, it can be circular). Furthermore, the interconnection regions and the continuity region can be misaligned.

The portions of the first or of the back-side interconnection region used according to the particular case for anchorage do not necessarily have to be in the form of frames that extend along the entire perimeter of the interconnection regions themselves. In other words, one between the first and the back-side interconnection region can project with respect to the other even only on one side, which is used for anchorage. In some cases, in which the front-side interconnection region is delimited by an insulating structure made of dielectric material filling the front-side insulation trench, the latter is sufficient to ensure also stability of the through via, and no further anchorages are required.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A process for manufacturing a through via in a semiconductor device, comprising:
    forming a body comprising a substrate and a structural layer, both of semiconductor material, and a dielectric layer, arranged between said substrate and said structural layer;
    removing a first portion of said structural layer to form a first trench bounding a second portion of said structural layer, the first portion extending through the structural layer to the dielectric layer;

insulating said structural layer to form a front-side interconnection region by depositing, in the first trench, an insulating material;

insulating a portion of said substrate to form a back-side interconnection region; and connecting said front-side interconnection region and said back-side interconnection region through said dielectric layer.

2. The process according to claim 1, wherein said connecting comprises forming a conductive continuity region through said dielectric layer.

3. The process according to claim 2, wherein said removing the first portion of said structural layer comprises forming the first trench along a closed line in said structural layer around said conductive continuity region, to separate said front-side interconnection region from said structural layer.

4. The process according to claim 2, wherein insulating a portion of said substrate comprises forming a back-side trench in said substrate around said conductive continuity region, to separate said back-side interconnection region from said substrate.

5. The process according to claim 4, wherein the first trench and said back-side trench are so deep as to reach said dielectric layer.

6. The process according to claim 4, wherein the first trench and said back-side trench extend along respective closed lines.

7. The process according to claim 1, further comprising the steps of anchoring said front-side interconnection region to said substrate by said dielectric layer and anchoring said back-side interconnection region to said front-side interconnection region.

8. The process according to claim 1, further comprising the steps of anchoring said back-side interconnection region to said structural layer by said dielectric layer and anchoring said front-side interconnection region to said back-side interconnection region.

9. The process according to claim 1, wherein said step of forming a body comprises:

forming at least one cavity in said substrate to delimit semiconductor structures;

growing epitaxially said structural layer on top of said at least one cavity starting from said semiconductor structures, closing said at least one cavity;

carrying out a process of annealing; and converting said semiconductor structures into dielectric material.

10. The process according to claim 9, further comprising making an electronic circuit integrated in said structural layer.

11. The process according to claim 1, further comprising providing a line of electrical connection between said front-side interconnection region and at least one point in said structural layer.

12. The process according to claim 11, wherein providing said electrical-connection line comprises embedding said electrical-connection line in said dielectric layer.

13. A semiconductor device comprising:

a body, the body including:

a substrate of semiconductor material;

a structural layer of semiconductor material;

a trench formed in the structural layer and bounding a portion of the structural layer, the trench having deposited therein an insulating material;

a dielectric layer arranged between said substrate and said structural layer; and an electronic circuit integrated in at least one layer of the body; and a through interconnection via traversing said body, comprising the portion of the structural layer and being connected to the electronic circuit;

wherein said through interconnection via extends through said dielectric layer.

14. The device according to claim 13, wherein said through interconnection via comprises:

a front-side interconnection region comprising the portion, laterally insulated from said structural layer by the insulating material, the front-side interconnection region being bounded by the trench;

a back-side interconnection region laterally insulated from said substrate; and a conductive continuity region connecting said front-side interconnection region and said back-side interconnection region and set passing through said dielectric layer.

15. The device according to claim 14, wherein said front-side interconnection region comprises a first anchoring portion, projecting laterally with respect to said back-side interconnection region and fixed to said substrate by said dielectric layer.

16. The device according to claim 14, wherein said back-side interconnection region comprises a second anchoring portion, projecting laterally with respect to said front-side interconnection region and fixed to said structural layer by said dielectric layer.

17. The device according to claim 13, wherein said structural layer is a monocrystalline epitaxial layer.

18. The device according to claim 17, wherein the electronic circuit is integrated in said monocrystalline epitaxial layer and partially comprises the monocrystalline epitaxial layer.

19. The device according to any one of claim 13, wherein said structural layer is made of polycrystalline material.

20. The device according to claim 19, wherein said structural layer houses at least partially a micro-electromechanical structure.

21. The device according to claim 13, wherein said substrate houses at least partially a micro-electromechanical structure.

22. The device according to claim 13, wherein the body further comprises a second trench formed in the substrate and bounding a second portion of the substrate, the second trench having deposited therein a second insulating material.

23. The device according to claim 22, wherein said through interconnection via comprises:

a front-side interconnection region comprising the portion, laterally insulated from said structural layer by the insulating material, the front-side interconnection region being bounded by the trench;

a back-side interconnection region comprising the second portion, laterally insulated from said substrate by the second insulating material, the back-side interconnection region being bounded by the second trench; and a conductive continuity region connecting said front-side interconnection region and said back-side interconnection region and set passing through said dielectric layer.

24. The device according to claim 22, wherein the through interconnection via further comprises the second portion of the substrate.

25. A device having a via, the device comprising:

a body comprising a first semiconductor layer, a second semiconductor layer, and an insulating layer disposed between the first semiconductor layer and the semiconductor second layer, the first semiconductor layer comprising at least one circuit;

a connective region comprising a first portion of the first semiconductor layer and extending through the insulating layer; and a trench formed in the first semiconductor layer, the trench bounding the first portion of the first semiconductor layer and extending through the first semiconductor layer to the insulating layer.

26. The device of claim 25, wherein the electronic device is a semiconductor wafer.

27. The device of claim 25, wherein each of the first semiconductor layer and second semiconductor layer has a same thickness as when the first semiconductor layer and second semiconductor layer are formed during the manufacturing of the device.

28. The device of claim 27, further comprising at least one connection line traversing the first trench to connect the at least one circuit to the connective region.

29. The device of claim 28, wherein the at least one connection line passes through the insulating layer.

30. The device of claim 28, wherein the at least one connection line is formed on a second insulating layer formed on the first semiconductor layer and the at least one connection line connects to the connective region and the first semiconductor layer through the second insulating layer.

31. The device of claim 25, further comprising a second trench formed in the second semiconductor layer, the second trench bounding a second portion of the second semiconductor layer and extending through the second semiconductor layer to the insulating layer, wherein the connective region further comprises the second portion of the second semiconductor layer and extends through the insulating layer to connect the first portion of the first semiconductor layer and the second portion of the second semiconductor layer.

32. The device of claim 25, wherein the first semiconductor layer in which the first trench is formed is an epitaxial layer.

33. The device of claim 32, wherein the epitaxial layer forms a portion of the at least one circuit.

34. The device of claim 25, wherein the second semiconductor layer comprises a semiconductor material that is a doped high conducting semiconductor material.

35. The device of claim 34, wherein the doped high conducting semiconductor material is doped monocrystalline silicon.

36. The device of claim 25, wherein the at least one circuit comprises at least one control circuit to process at least one information signal.

37. The device of claim 25, wherein the at least one circuit comprises at least one sensor circuit to generate at least one information signal.

* * * * *